United States Patent [19]

LeGresley

[11] Patent Number: 4,498,174
[45] Date of Patent: Feb. 5, 1985

[54] PARALLEL CYCLIC REDUNDANCY CHECKING CIRCUIT

[75] Inventor: Barry P. LeGresley, Port Moody, Canada

[73] Assignee: AEL Microtel Limited, Northlake, Ill.

[21] Appl. No.: 411,199

[22] Filed: Aug. 25, 1982

[51] Int. Cl.³ .............................................. G06F 11/10
[52] U.S. Cl. ........................................ 371/37; 371/25; 371/38
[58] Field of Search ........................ 371/37, 38, 43, 48, 371/21, 25

[56] References Cited

U.S. PATENT DOCUMENTS 3,452,328  6/1969  Hsiao et al. ........................... 371/37

Primary Examiner—Jerry Smith
Assistant Examiner—Mark Ungerman

[57] ABSTRACT

A parallel cyclic redundancy checking circuit which determines the validity of digital, binary, cyclical data. The parallel structure of this circuit enables it to check high frequency data. Shift registers are used to store sequentially occurring parallel groups of data and a feedback network comprising exclusive-or gates provide a coding arrangement which produces a resultant data pattern to indicate the validity of the cyclical parallel input data.

9 Claims, 2 Drawing Figures

PARALLEL CYCLIC REDUNDANCY CHECKING CIRCUIT

FIELD OF THE INVENTION

The present invention relates to data verification circuits and more particularly to a parallel cyclic redundancy checking circuit.

BACKGROUND OF THE INVENTION

Cyclical redundancy checking circuits are well known. However they typically use a serial logic configuration comprising a 16-bit shift register with four outputs fed back to exclusive-or logic at the input. An example of such a circuit is the Hewlett Packard Signature Analysis System.

This serial configuration of the prior art requires that each data bit be clocked serially into the cyclical redundancy checking circuit. The time required to perform this operation is therefore equivalent to the number of bits per sample multiplied by the period of the CLOCK signal. For many applications such an arrangement requires more time than is allowed between successive input data groups.

Accordingly the present invention provides a high speed cyclic redundancy checking circuit capable of determining the validity of high frequency parallel groups of data.

SUMMARY OF THE INVENTION

The parallel cyclic redundancy checking circuit of the present invention determines the validity of cyclical data. Eight data bits, e.g. a pulse code modulation (PCM) sample data group, are periodically applied to the input of this circuit. Therefore each data pattern is repeated after a predetermined time.

This 8-bit data group is divided into four groups of two bits each. A first SELECT pulse enables the first bit of each of the four groups, e.g. odd numbered bits, to pass through a data selection circuit, and a second SELECT pulse enables the second bit, of each group e.g. even numbered bits, to pass through the data selection circuit. Therefore, all eight bits are transferred into the checking circuit during the same time that only two bits could be transferred in the conventional circuit.

The data selection circuit has four output signals, one for each group of two bits. Each output signal is applied to a shift register via an exclusive-or gate. The output signal from each shift register is applied to another exclusive-or gate and the output signal from this gate is then combined with an associated output signal from the data selection circuit. These signals are then fed back into the shift register via the first exclusive-or circuit.

A CLEAR signal is generated at the beginning of each cycle of data to reset the shift registers. These shift registers are then clocked by a clock signal which occurs in synchronism with each 4-bit data group. Therefore each group of four data bits is clocked through the data selection circuit and applied to the shift register via an exclusive-or circuit whose output is dependent on both the incoming data bits and contents of the shift register.

This exclusive-or circuit provides a data coding arrangement which has a high probability of detecting an invalid data pattern. At the end of each cycle, the shift register contains a resultant data pattern which can be compared to an expected data pattern.

DESCRIPTION OF THE PREFERRED EMBODIMENT

Figure 1:
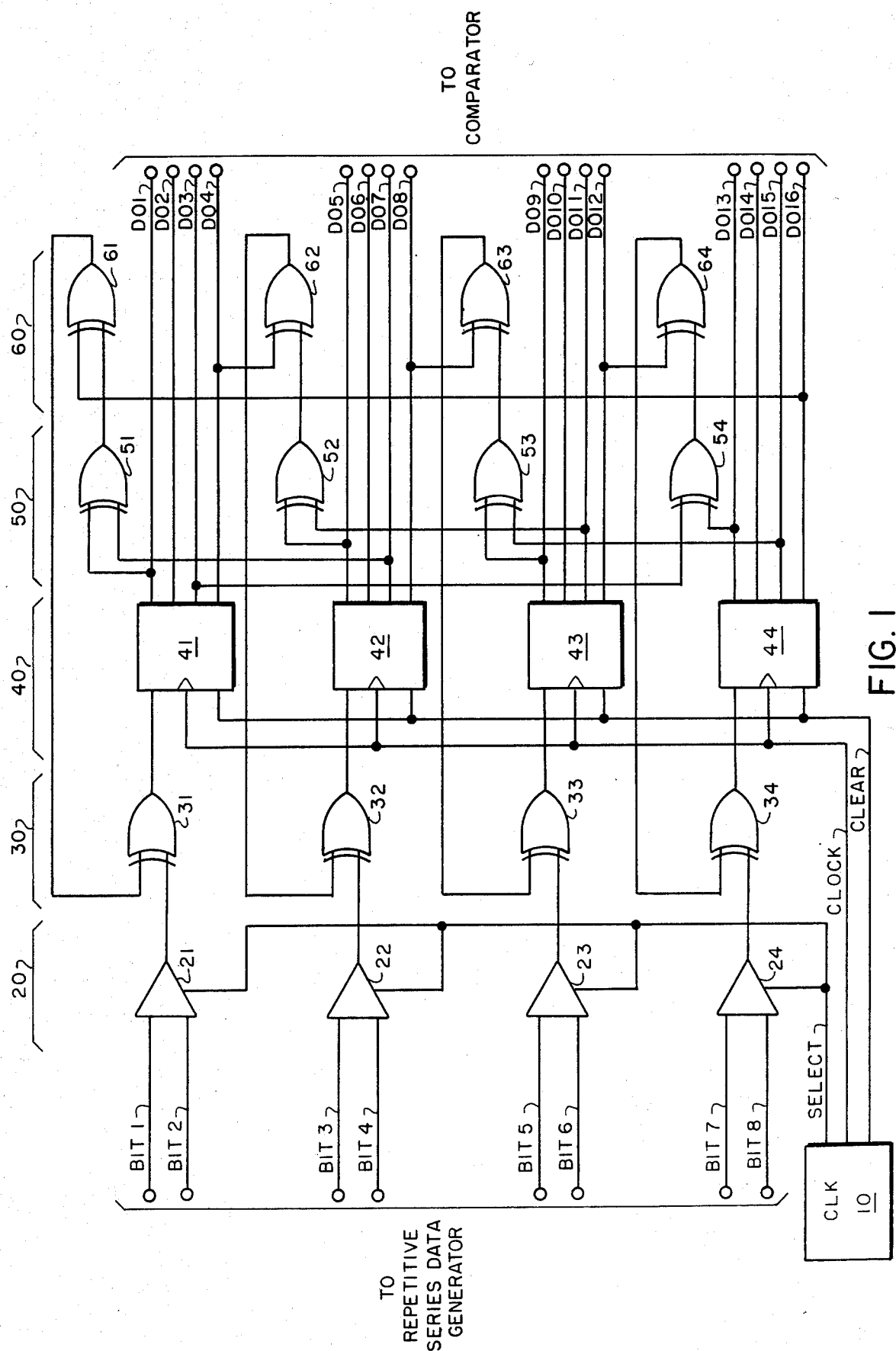
FIG. 1 is a schematic diagram of the cyclic redundancy checking circuit of the present invention.
Figure 2:
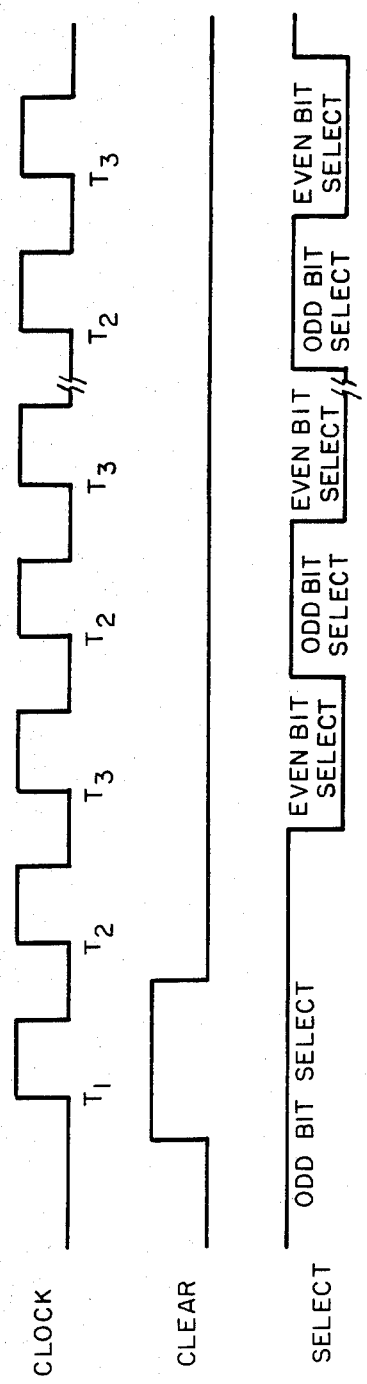
FIG. 2 is a timing diagram showing the relative timing of CLOCK, CLEAR and SELECT signals.

Referring now to FIG. 1, the cyclic redundancy checking circuit of the present invention is shown connected between a repetitive series data generator and a comparison circuit. Data selection circuit 20 includes a plurality of 2:1 selectors, each of which is connected between the repetitive series data generator and an associated exclusive-or gate in exclusive-or circuit 30.

The output of these exclusive-or gates is connected to an associated shift register in shift register circuit 40. Exclusive-or circuit 50 includes a plurality of exclusive-or gates and connected to two shift registers. Exclusive-or circuit 60 includes a plurality of exclusive-or gates each connected to a third shift register and the output of an associated exclusive-or gate in exclusive-or circuit 50. The output of each exclusive-or gate in exclusive-or circuit 60 is then connected to an input of an associated exclusive-or gate in exclusive-or circuit 30.

Clock circuit 10 is connected to data selection circuit 20 via a SELECT lead, and it is connected to shift register circuit 40 via CLEAR and CLOCK leads.

Parallel 8-bit data samples are periodically applied to the inputs of multiplexer 20 with two bits being applied to each of the four 2:1 selectors, 21-24.

The SELECT signal from clock circuit 10 alternately enables the odd and even bits through data selection circuit 20. Thus bits 1, 3, 5 and 7 are applied to the second input of exclusive-or gates 31, 32, 33 and 34, respectively, while the SELECT signal is at a logic level 1. Similarly bits 2, 4, 6 and 8 are applied to the second input of exclusive-or gates 31, 32, 33 and 34, respectively, while the SELECT signal is at logic level 0. Depending on whether a logic level 0 or logic level 1 signal is applied by exclusive-or circuits 50 and 60 to the first input of exclusive-or gates 31, 32, 33 and 34, the bit patterns applied to the second input of each of these gates is either gated, to the associated shift register unchanged or inverted and then gated to the associated shift register.

Clock circuit 10 generates a CLEAR signal at the beginning of each series of parallel data groups, to reset the shift registers of shift register circuit 40. Therefore, these shift registers all have logic level 0 signals on their outputs. Each exclusive-or gate in exclusive-or circuit 50 then provides a logic level 0 at its output since logic level 0 signals appear at both inputs. Similarly logic level 0 signals from an associated shift register or the associated exclusive-or gate in exclusive-or circuit 50 appear at both inputs of each exclusive-or gate in exclusive-or circuit 60. Therefore the outputs of these gates provide a logic level 0 signal to the input of the associated exclusive-or gate in exclusive-or circuit 30. Since one input of each of these gates has a logic level 0 signal applied to it, the signal at other input, from the associated data selector circuit, will be gated through the exclusive-or gate and applied to the input of corresponding shift register in shift register circuit 40. The data applied to the inputs of the shift registers is then clocked into each shift register on the next clock pulse from clock circuit 10.

Each pair of exclusive-or gates in exclusive-or circuits 50 and 60 is connected to outputs from shift registers in shift register circuit 40 according to a predetermined pattern. This pattern is arranged such that each exclusive-or gate pair is connected to the first, third and fourth outputs of three different shift registers. For example, exclusive-or gate pair, 51 and 61, is connected to the first output of shift register 41, the third output of shift register 42 and the fourth output of shift register 44.

Through use of this arrangement of exclusive-or circuits, incoming data bits are logically gated, or inverted, and fed back to the shift registers in such a manner that the pattern stored in the shift registers at the end of each series of incoming data groups, has a high probability of indicating the validity of such entire series of data. Since the input data is provided by a repetitive series data generator, valid input data is known and consequently the resultant pattern of such a series of valid data can be computed. This resultant data pattern can then be stored in a reference signal source. A comparator can then compare the data in the reference signal source to the resultant data stored in the shift registers at the end of each series of input data to determine whether any input data bit is incorrect.

The present invention thus provides a cyclic redundancy check on parallel input data through use of a data selection circuit, a shift register circuit and an exclusive-or circuit which is fed back to the input of the shift register circuit. The exclusive-or circuit generates a resultant pattern representing a complete cycle of input data which can be compared to an expected data pattern to determine if there has been a failure in the input data.

It will be obvious to those skilled in the art that numerous modifications of the present invention can be made without departing from the spirit of the invention which shall be limited only by the scope of the claims appended hereto.

What is claimed is:

1. A cyclic redundancy checking circuit for use in a data verification system including a comparator a data generator operated to provide a repetitive series of groups of parallel data bits, and a signal generator operated to periodically provide a clear signal associated with one group of said parallel data bits, said cyclic redundancy checking circuit comprising:
   first coding means connected to said data generator, operable to provide a first coded signal associated with each group of parallel data bits;
   first-in-first out storage means of predetermined capacity connected to said signal generator and said first coding means, said storage means initialized to a reset state in response to said clear signal, further operative to store a predetermined number of said first coded signals and further operative to provide a storage signal associated with each stored first coded signal;
   second coding means connected to said storage means and said comparator, operative in response to said storage signal to provide a second coded signal; and
   said first coding means further connected to said second coding means, operative in response to each group of parallel data bits and said second coded signal to provide said first coded signal.

2. A cyclic redundancy checking circuit as claimed in claim 1, wherein said signal generator periodically operates to provide a select signal associated with each group of parallel data bits, said cyclic redundancy checking circuit further comprising: a plurality of data selectors each connected to said signal generator and further connected between said data generator and said first coding means, each operative in response to said select signal to gate a first selected data bit of each group of parallel data bits to said first coding means, and further operative in response to an absence of said select signal to gate a second selected data bit of each group of parallel data bits to said first coding means.

3. A cyclic redundancy checking circuit as claimed in claim 2, wherein said first coding means comprises: a plurality of exclusive-or gates, each connected to an associated one of said data selectors and said second coding means, each operative to provide first or second coded data bits associated with said first or second selected data bits, respectively.

4. A cyclic redundancy checking circuit as claimed in claim 3, wherein said signal generator further operates to provide a clock signal associated with each group of parallel data bits, said storage means comprising:
   a plurality of shift registers each having a clock input, and a clear input, both connected to said signal generator, each shift register further having a serial input connected to an associated one of said plurality of exclusive-or gates, and each shift register further having a plurality of bit positions and associated outputs; each shift register operative in response to said clear signal to provide a logic level 0 signal on each output; each shift register further operative to sequentially store each first and second coded data bit, on an alternating basis, in response to each alternate clock pulse; each shift register further operated to shift all stored data bits by one bit position, in response to each clock pulse; and each shift register further operated to provide a plurality of stored data bit signals on said plurality of outputs.

5. A cyclic redundancy checking circuit as claimed in claim 4, wherein each shift register has at least three outputs, said second coding means comprising:
   a second plurality of exclusive-or gates each having first and second inputs, each of said second plurality having its first input connected to a first output of a first associated shift register, each of said second plurality having its second input connected to a second output of a second associated shift register; and
   a third plurality of exclusive-or gates, each having first and second inputs, each of said third plurality having its first input connected to an associated one of said second plurality of exclusive-or gates, and each of said third plurality having its second input connected to a third output of a third associated shift register, each of said second and third pluralities of said exclusive-or gates operated in combination, in response to said stored data bit signals appearing at said first, second and third outputs to provide a third coded data bit.

6. A cyclic redundancy checking circuit as claimed in claim 5, wherein: said first plurality of exclusive-or gates is further connected to an associated one of said third plurality of exclusive-or gates, each of said first plurality of exclusive-or gates operated in response to said third coded data bit and said first or second selected data bits, to provide said first or second coded data bit, respectively.

7. A cyclic redundancy checking circuit as claimed in claim 4, wherein said storage means comprises:

four 4-bit shift registers each having four outputs.

8. A cyclic redundancy checking circuit as claimed in claim 3, wherein said first plurality of exclusive-or gates includes four such gates.

9. A cyclic redundancy checking circuit as claimed in claim 2, wherein each group of parallel data bits includes eight bits, said plurality of data selectors includes four data selectors each associated with two of said parallel data bits.

* * * * *